(12) United States Patent
Chen et al.

(10) Patent No.: US 11,540,630 B2
(45) Date of Patent: Jan. 3, 2023

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chi-Chih Chou, Kaohsiung (TW); Chun-Chiang Wang, Kaohsiung (TW)

(73) Assignees: King Slide Words Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/180,023

(22) Filed: Feb. 19, 2021

(65) Prior Publication Data

US 2022/0160127 A1 May 26, 2022

(30) Foreign Application Priority Data

Nov. 24, 2020 (TW) .................................. 109141493

(51) Int. Cl.
*A47B 88/423* (2017.01)
*A47B 88/49* (2017.01)
(52) U.S. Cl.
CPC ............ *A47B 88/423* (2017.01); *A47B 88/49* (2017.01); *A47B 2210/007* (2013.01); *A47B 2210/0016* (2013.01)

(58) Field of Classification Search
CPC .................. A47B 88/423; A47B 88/49; A47B 2210/0016; A47B 2210/007
See application file for complete search history.

(56) References Cited

U.S. PATENT DOCUMENTS

| | | | | |
|---|---|---|---|---|
| RE28,344 E | * | 2/1975 | Monaco | F16C 29/02 384/21 |
| 6,820,954 B2 | | 11/2004 | Judge et al. | |
| 7,364,244 B2 | * | 4/2008 | Sandoval | H05K 7/1421 312/334.46 |
| 7,628,460 B1 | * | 12/2009 | Huang | A47B 88/493 312/334.44 |
| 8,282,176 B1 | * | 10/2012 | Chen | A47B 88/493 312/334.46 |
| 8,403,432 B2 | * | 3/2013 | Chen | A47B 88/43 312/334.46 |
| 10,092,100 B1 | * | 10/2018 | Chen | A47B 88/57 |
| 10,231,540 B1 | * | 3/2019 | Hong | E05B 65/46 |
| 10,244,868 B2 | | 4/2019 | Chen et al. | |
| 10,362,870 B1 | * | 7/2019 | Smith | A47B 88/50 |
| 10,631,639 B2 | * | 4/2020 | Chen | H05K 7/1489 |

(Continued)

FOREIGN PATENT DOCUMENTS

TW         I698201 B      7/2020

*Primary Examiner* — Hanh V Tran
(74) *Attorney, Agent, or Firm* — Rosenberg, Klein & Lee

(57) ABSTRACT

A slide rail assembly includes a first rail, a second rail, and a third rail. The first rail includes a supporting feature. The second rail can be displaced with respect to the first rail. The third rail is movably disposed between the first rail and the second rail. When the slide rail assembly is in a predetermined state, the supporting feature protrudes beyond an end portion of the third rail by a predetermined distance and supports the second rail.

13 Claims, 11 Drawing Sheets

(56) References Cited

U.S. PATENT DOCUMENTS

| | | | |
|---|---|---|---|
| 2003/0209959 A1* | 11/2003 | Shih-Long | A47B 88/49 312/334.46 |
| 2004/0056572 A1* | 3/2004 | Chen | A47B 88/473 312/333 |
| 2011/0169389 A1* | 7/2011 | Jeffries | B21C 23/142 292/336.3 |
| 2012/0043872 A1* | 2/2012 | Enos | A47B 88/493 312/332.1 |
| 2012/0169199 A1* | 7/2012 | Chen | A47B 88/57 312/334.44 |
| 2012/0187816 A1* | 7/2012 | Chen | E05B 65/463 312/334.8 |
| 2013/0058596 A1* | 3/2013 | Chen | F16C 29/048 384/7 |
| 2014/0152165 A1* | 6/2014 | Zimmermann | E05B 65/46 312/333 |
| 2014/0363108 A1* | 12/2014 | Chen | A47B 88/43 384/22 |
| 2015/0189989 A1* | 7/2015 | Chen | H05K 7/1489 248/219.3 |
| 2015/0201754 A1* | 7/2015 | Chen | A47B 96/07 248/219.3 |
| 2016/0135325 A1 | 5/2016 | Chen et al. | |
| 2016/0278522 A1* | 9/2016 | Chen | A47B 88/407 |
| 2017/0112016 A1* | 4/2017 | Chen | A47B 88/43 |
| 2017/0156498 A1* | 6/2017 | Chen | E05B 65/46 |
| 2017/0196354 A1* | 7/2017 | Chen | A47B 88/43 |
| 2018/0087572 A1* | 3/2018 | Chen | F16C 35/02 |
| 2018/0092462 A1* | 4/2018 | Chen | A47B 88/493 |
| 2018/0295990 A1* | 10/2018 | Chen | A47B 88/443 |
| 2019/0059585 A1* | 2/2019 | Chen | A47B 88/43 |
| 2019/0063493 A1* | 2/2019 | Chen | H05K 7/1489 |
| 2019/0298060 A1* | 10/2019 | Chen | A47B 88/483 |
| 2020/0107636 A1* | 4/2020 | Chen | H05K 7/1489 |
| 2020/0405053 A1* | 12/2020 | Park | A47B 88/483 |

* cited by examiner

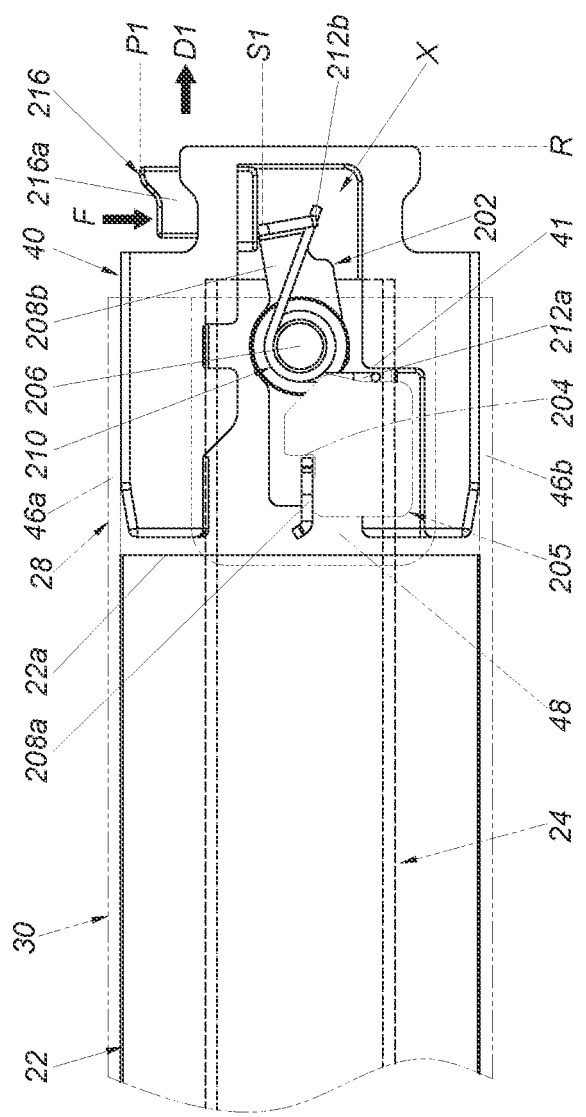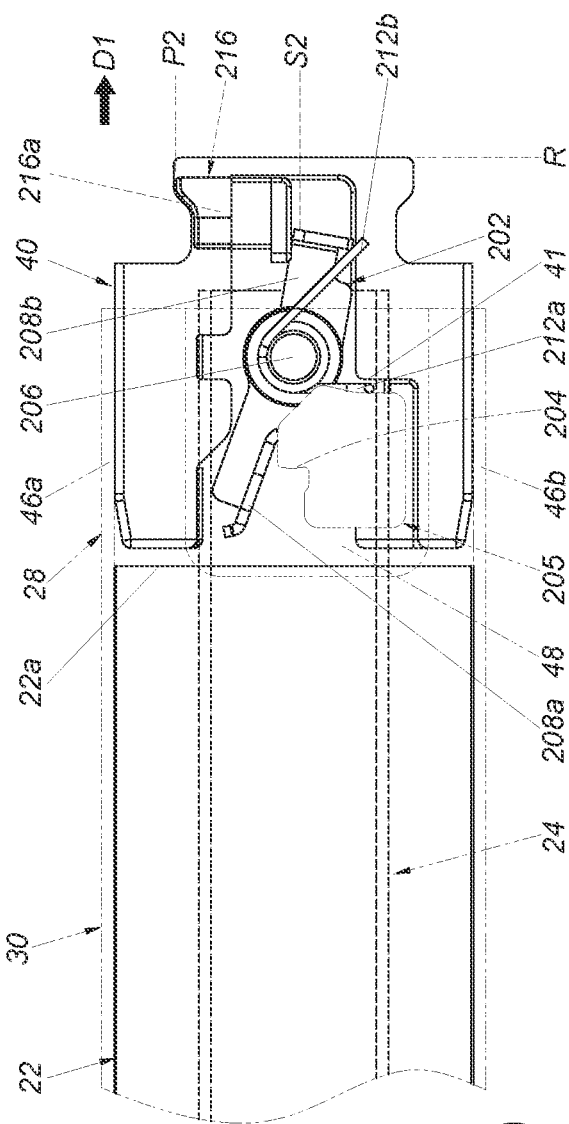

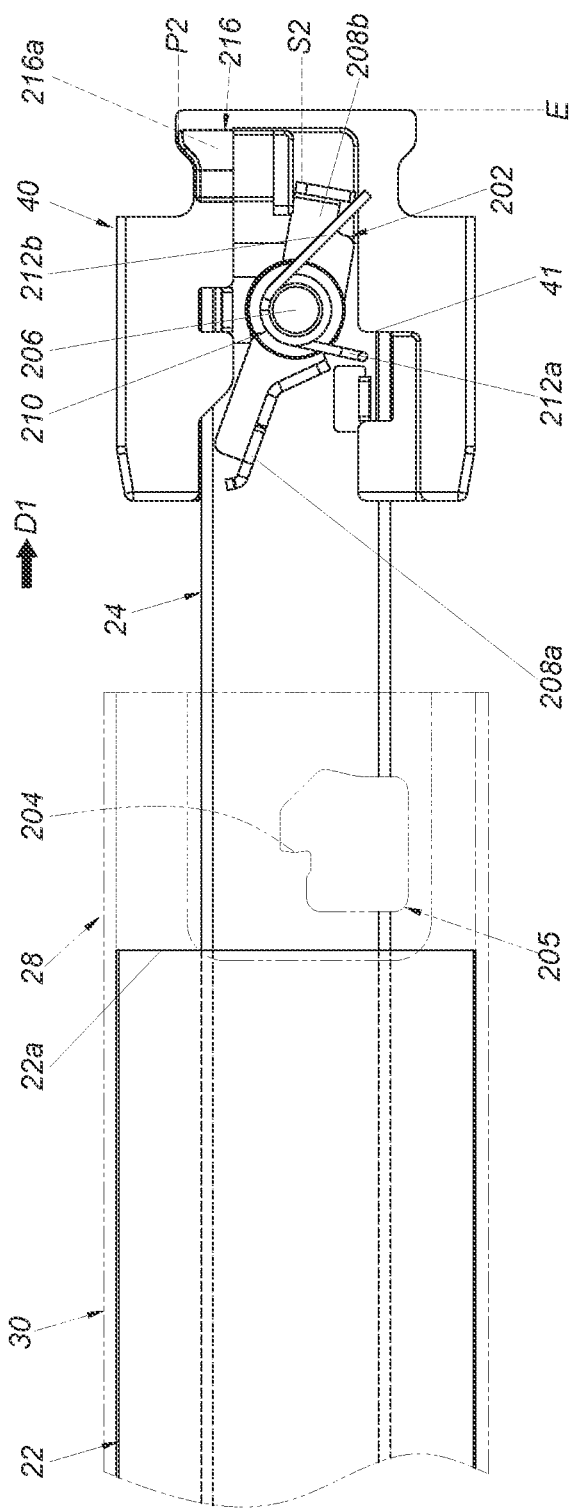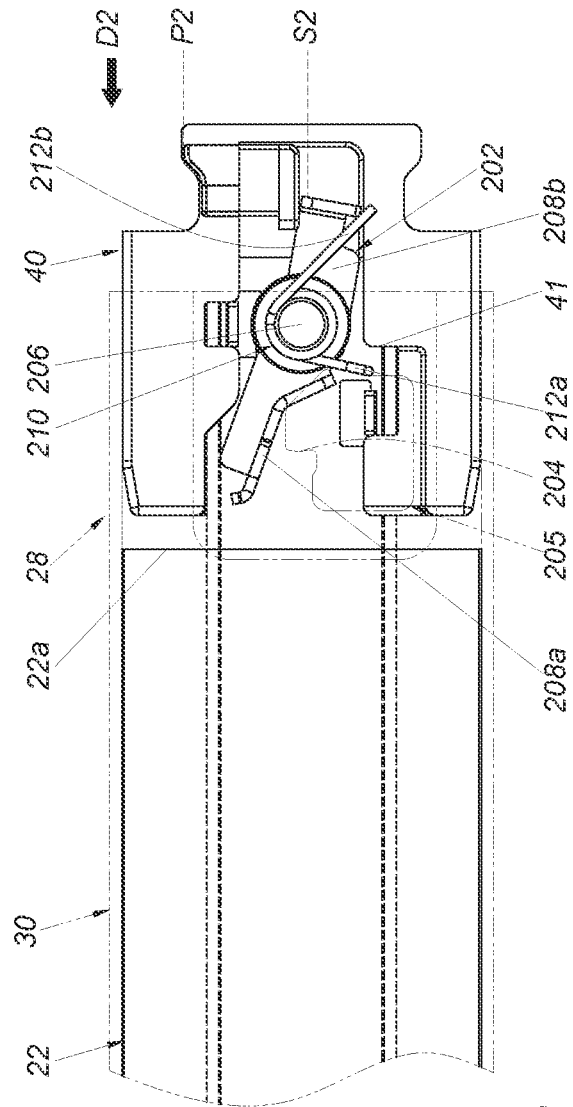
FIG. 11
FIG. 12

SLIDE RAIL ASSEMBLY

FIELD OF THE INVENTION

The present invention relates to a slide rail and more particularly to a slide rail assembly that can provide additional support for a slide rail thereof (i.e., can increase the strength with which the structure of the slide rail is supported) when the slide rail is at a retracted position, regardless of whether the slide rail is provided with a retracted position locking mechanism.

BACKGROUND OF THE INVENTION

U.S. Pat. No. 6,820,954 B2 (hereinafter referred to as the '954 patent for short) discloses a slide rail assembly that includes an outer rail, a middle rail, and an inner rail. When the outer rail, the middle rail, and the inner rail are extended with respect to one another such that the slide rail assembly is in an extended state, the inner rail is locked with respect to the middle rail via a controller (see FIG. 6 or FIG. 16 of the '954 patent). The '954 patent, however, neither discloses that the inner rail is supported by the outer rail (or a related component on the outer rail) when retracted with respect to the outer rail, nor discloses that the slide rail assembly has a locking mechanism for locking the inner rail when the inner rail is retracted with respect to the outer rail.

U.S. Pat. No. 10,244,868 B2 (hereinafter referred to as the '868 patent for short) discloses a slide rail assembly that includes a first rail, a second rail, and a third rail, all of which can be displaced with respect to one another. The second rail can be locked at a retracted position with respect to the first rail (see FIG. 17 of the '868 patent) to shorten the overall length of the slide rail assembly, thereby allowing the slide rail assembly to be used in a narrow space (see FIG. 21 of the '868 patent). The '868 patent, however, neither discloses that the third rail is supported by the first rail (or a related component on the first rail) when retracted with respect to the first rail, nor discloses that the slide rail assembly has a locking mechanism for locking the third rail when the third rail is retracted with respect to the first rail.

U.S. Pat. No. 10,631,639 B2 (hereinafter referred to as the '639 patent for short) discloses a slide rail assembly that includes a first rail, a second rail, and a third rail movably mounted between the first rail and the second rail. When the second rail is at a retracted position with respect to the first rail, an operating member and a blocking member are blocked by each other to prevent the second rail from being displaced from the retracted position in a first direction (e.g., an opening direction) (see FIG. 5 of the '639 patent). The operating member, however, is not supported by the first rail (or a related component on the first rail) when the second rail is at the retracted position with respect to the first rail; in other words, the structural strength or supporting strength of the slide rail assembly still leaves something to be desired.

U.S. Pat. No. 8,282,176 B1 (hereinafter referred to as the '176 patent for short) discloses a slide rail assembly that includes a first rail, a second rail, and a third rail movably mounted between the first rail and the second rail. When the second rail is at a retracted position with respect to the first rail (see FIG. 6 of the '176 patent), a locking member and a stop are blocked by each other to prevent the second rail from being displaced from the retracted position in an opening direction, and the operating portion of a release member can be pulled outward to pivot the locking member away from the stop. The release member, however, is not supported by the first rail (or a related component on the first rail) when the second rail is at the retracted position with respect to the first rail, meaning the structural strength or supporting strength of the slide rail assembly still leaves something to be desired.

SUMMARY OF THE INVENTION

The present invention relates to a slide rail assembly capable of enhancing the structural strength of a slide rail thereof when the slide rail is at a retracted position. According to one aspect of the present invention, a slide rail assembly includes a first rail, a second rail, and a third rail. The first rail includes a supporting feature. The second rail can be longitudinally displaced with respect to the first rail. The third rail is movably disposed between the first rail and the second rail. When the slide rail assembly is in a predetermined state, the supporting feature protrudes beyond an end portion of the third rail by a predetermined longitudinal distance and supports the second rail.

Preferably, the supporting feature is adjacent to an end portion of the first rail.

Preferably, the slide rail assembly further includes a connecting member disposed at the second rail, and the supporting feature supports the second rail via the connecting member when the slide rail assembly is in the predetermined state.

Preferably, the connecting member is adjacent to and connected to an end portion of the second rail.

Preferably, the connecting member includes an upper section, a lower section, and a middle section between the upper section and the lower section; and the supporting feature includes an upper supporting wall, a lower supporting wall, and a middle wall connected between the upper supporting wall and the lower supporting wall. The lower supporting wall of the supporting feature is configured to support the lower section of the connecting member.

Preferably, the upper supporting wall of the supporting feature is configured to support the upper section of the connecting member.

Preferably, the upper supporting wall and the lower supporting wall of the supporting feature are configured to at least partially enclose the upper section and the lower section of the connecting member respectively.

Preferably, the first rail has a first wall, a second wall, and a longitudinal wall connected between the first wall and the second wall of the first rail, and the first rail is provided with a supporting member, wherein the supporting member has a first supporting portion, a second supporting portion, and a longitudinal portion connected between the first supporting portion and the second supporting portion of the supporting member. The first supporting portion, the second supporting portion, and the longitudinal portion of the supporting member are respectively adjacent to the first wall, the second wall, and the longitudinal wall of the first rail.

Preferably, the first wall, the second wall, and the longitudinal wall of the first rail jointly define a first channel for receiving the third rail, and the third rail has a plurality of walls that jointly define a second channel for receiving the second rail.

According to another aspect of the present invention, a slide rail assembly includes a first rail, a second rail, a third rail, and a locking member. The first rail includes a supporting feature. The second rail can be longitudinally displaced with respect to the first rail. The third rail is movably disposed between the first rail and the second rail. The locking member can be moved with respect to the second rail. When the slide rail assembly is in a retracted state, the third rail is retracted with respect to the first rail, and the second rail is at a retracted position with respect to the third rail, is locked with respect to the first rail by the locking member in a locking state, and is thereby kept from moving away from the retracted position in an opening direction. Moreover, when the slide rail assembly is in the retracted state, the supporting feature protrudes beyond an end portion of the third rail by a predetermined longitudinal distance and supports the second rail.

Preferably, once the locking member is operated and thereby switched to an unlocking state, the second rail is no longer locked with respect to the first rail and is allowed to move away from the retracted position in the opening direction.

Preferably, the slide rail assembly further includes a connecting member disposed at the second rail, and the locking member is connected to one of the second rail and the connecting member in an operable manner. The supporting feature supports the second rail via the connecting member when the slide rail assembly is in the retracted state.

Preferably, the locking member can be operated and thus moved in a receiving space of the connecting member, and at least a portion of the locking member is exposed from the receiving space when the locking member is in one of the locking state and the unlocking state.

Preferably, a predetermined portion of the connecting member has at least one identification feature from which a user can tell if the locking member is in one of the locking state and the unlocking state.

Preferably, the slide rail assembly further includes an operating member with which to operate the locking member and thereby switch the locking member from the locking state to the unlocking state.

Preferably, the operating member can be operated and thus moved in a receiving space of the connecting member, and at least a portion of the operating member is exposed from the receiving space when the locking member is in one of the locking state and the unlocking state.

Preferably, the connecting member has a main body portion; the main body portion includes an upper section, a lower section, and a middle section between the upper section and the lower section; and the supporting feature includes an upper supporting wall, a lower supporting wall, and a middle wall connected between the upper supporting wall and the lower supporting wall. The upper supporting wall and the lower supporting wall of the supporting feature are configured to support the upper section and the lower section of the main body portion respectively.

Preferably, the connecting member further includes an extension portion connected to the middle section of the main body portion, and the operating member is movably mounted on the extension portion of the connecting member.

Preferably, the first rail is provided with a supporting member, a blocking portion is disposed at one of the supporting member and the first rail and is configured to lock the locking member in the locking state, and the supporting feature is disposed at the supporting member.

According to yet another aspect of the present invention, a slide rail assembly adapted for use on a rack includes a first rail, a second rail, and a third rail. The first rail is configured to be mounted on the rack via a mounting member and includes a supporting feature. The second rail can be longitudinally displaced with respect to the first rail. The third rail is movably disposed between the first rail and the second rail. When the slide rail assembly is in a retracted state, the third rail is retracted with respect to the first rail, and the mounting member is adjacent to an end portion of the third rail. Moreover, when the slide rail assembly is in the retracted state, the supporting feature protrudes beyond the end portion of the third rail by a predetermined longitudinal distance and supports the second rail.

BRIEF DESCRIPTION OF THE DRAWINGS

FIG. 9 is a schematic view showing that the slide rail assembly according to the second embodiment of the present invention is in the predetermined state, with the second rail locked with respect to the first rail;

FIG. 10 is a schematic view showing that the slide rail assembly according to the second embodiment of the present invention is in the predetermined state, with the second rail no longer being locked with respect to the first rail;

FIG. 11 is a schematic view showing that the slide rail assembly according to the second embodiment of the present invention is displaced with respect to the first rail in an opening direction;

FIG. 12 is a schematic view showing that the slide rail assembly according to the second embodiment of the present invention is displaced with respect to the first rail in a retracting direction;

DETAILED DESCRIPTION OF THE INVENTION

Figure 1:
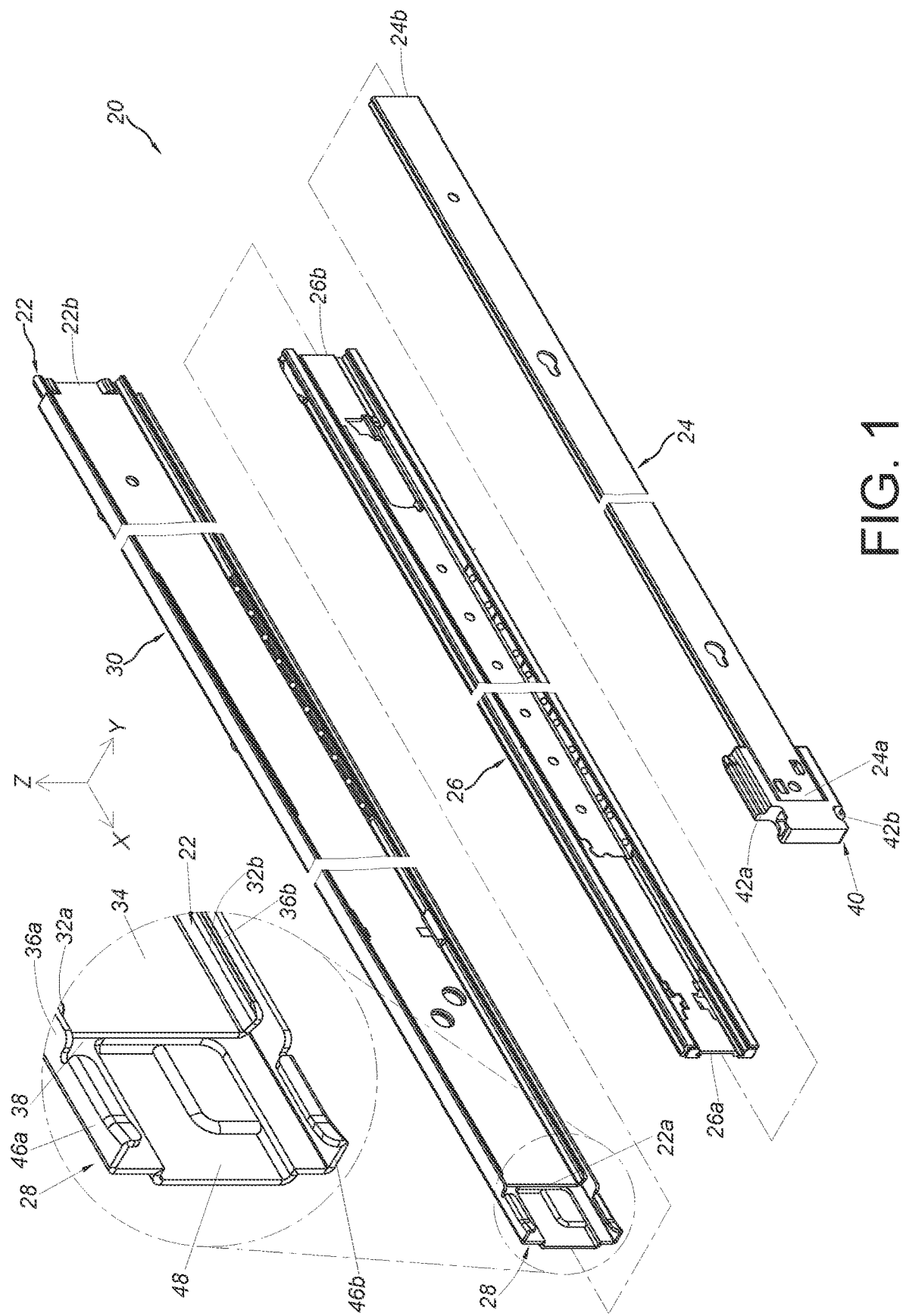
FIG. 1 is an exploded perspective view of the slide rail assembly according to a first embodiment of the present invention.
Figure 2:
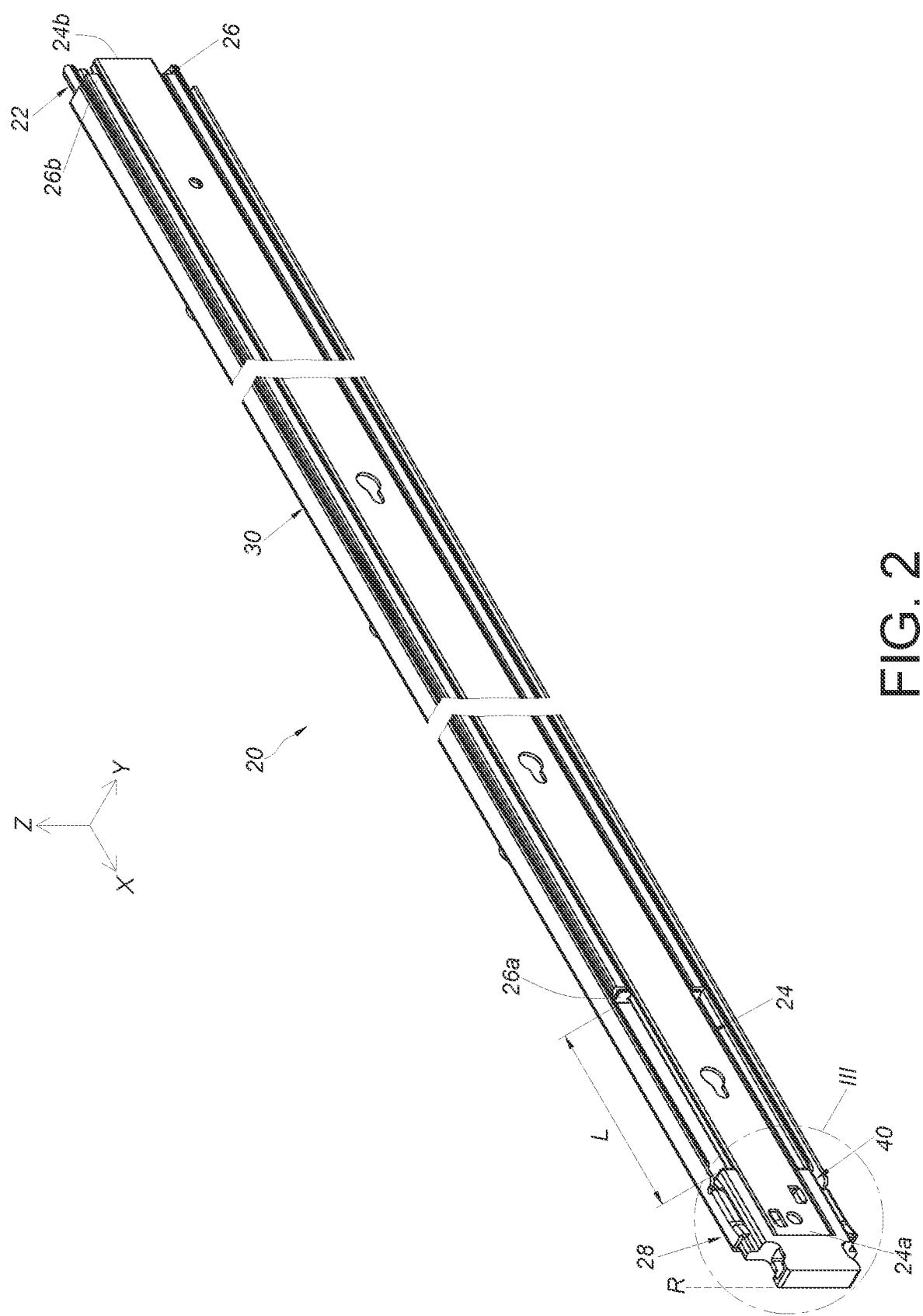
FIG. 2 is an assembled perspective view of the slide rail assembly according to the first embodiment of the present invention.

Referring to FIG. 1 and FIG. 2, the slide rail assembly 20 according to the first embodiment of the present invention includes a first rail 22 (e.g., an outer rail), a second rail 24

(e.g., an inner rail), and a third rail 26 (e.g., a middle rail) movably disposed between the first rail 22 and the second rail 24. Each of the first rail 22, the second rail 24, and the third rail 26 has a first end portion and a second end portion, such as but not limited to a front end portion and a rear end portion. More specifically, the first rail 22 has a first end portion 22a and a second end portion 22b, the second rail 24 has a first end portion 24a and a second end portion 24b, and the third rail 26 has a first end portion 26a and a second end portion 26b. The third rail 26 is shorter than the first rail 22 and the second rail 24 while the first rail 22 and the second rail 24 are of substantially the same length (but are not necessarily so in practice). The first rail 22, the second rail 24, and the third rail 26 can be longitudinally displaced with respect to one another. It is worth mentioning that in this embodiment, the X-axis direction is defined as the longitudinal direction (or the length direction or displacement direction of the slide rails), the Y-axis direction as the transverse direction (or the lateral direction of the slide rails), and the Z-axis direction as the vertical direction (or the height direction of the slide rails).

The first rail 22 includes a supporting feature 28. Preferably, the supporting feature 28 is adjacent to one of the end portions (e.g., the first end portion 22a) of the first rail 22. Here, by way of example, the first rail 22 is provided with a supporting member 30, the supporting member 30 is connected (e.g., fixedly connected) to the first rail 22 and can therefore be viewed as a part of the first rail 22, and the supporting feature 28 is disposed at the supporting member 30. More specifically, the supporting feature 28 in this embodiment is integrated with the supporting member 30, so the first rail 22, the supporting member 30, and the supporting feature 28 can be viewed as a single unit.

Preferably, as shown in FIG. 1, the first rail 22 has a first wall 32a, a second wall 32b, and a longitudinal wall 34 connected between the first wall 32a and the second wall 32b of the first rail 22. The supporting member 30 has a first supporting portion 36a, a second supporting portion 36b, and a longitudinal portion 38 connected between the first supporting portion 36a and the second supporting portion 36b of the supporting member 30. The first supporting portion 36a, the second supporting portion 36b, and the longitudinal portion 38 of the supporting member 30 are respectively adjacent to the first wall 32a, the second wall 32b, and the longitudinal wall 34 of the first rail 22.

Preferably, the first wall 32a, the second wall 32b, and the longitudinal wall 34 of the first rail 22 jointly define a first channel for receiving the third rail 26, and likewise, the third rail 26 has a plurality of walls that jointly define a second channel for receiving the second rail 24.

When the slide rail assembly 20 is in a predetermined state (e.g., the retracted state shown in FIG. 2), the third rail 26 is retracted with respect to the first rail 22, the second rail 24 is at a retracted position R with respect to the third rail 26 or the first rail 22, and the supporting feature 28 protrudes beyond one of the end portions (e.g., the first end portion 26a) of the third rail 26 by a predetermined longitudinal distance L and supports the second rail 24.

Preferably, the slide rail assembly 20 further includes a connecting member 40 disposed at the second rail 24. For example, the connecting member 40 is connected (e.g., fixedly connected) to the second rail 24 and can therefore be viewed as a part of the second rail 24, and the connecting member 40 is connected to one of the end portions (e.g., the first end portion 24a) of the second rail 24. The connecting member 40 may be mechanically engaged with, fastened to, connected in an abutting manner to, or riveted to the second rail 24 without limitation. When the slide rail assembly 20 is in the predetermined state, the supporting feature 28 supports the second rail 24 via the connecting member 40, as shown in FIG. 2.

Figure 3:
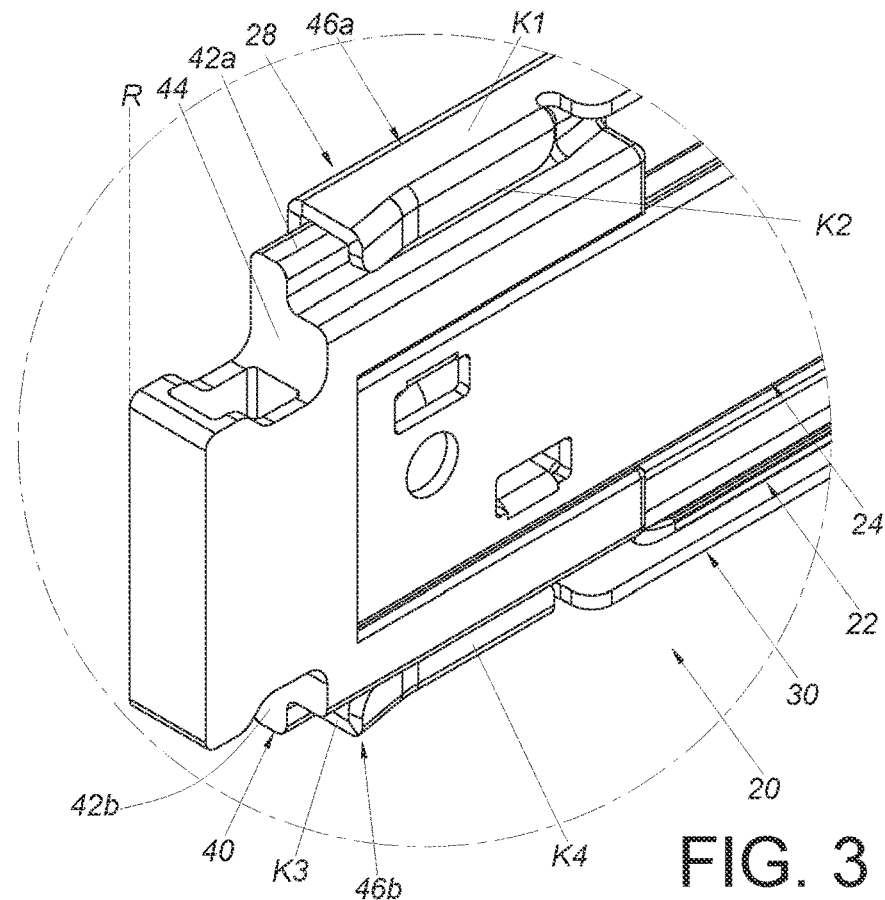
FIG. 3 is an enlarged view of the designated area in FIG. 2.
Figure 4:
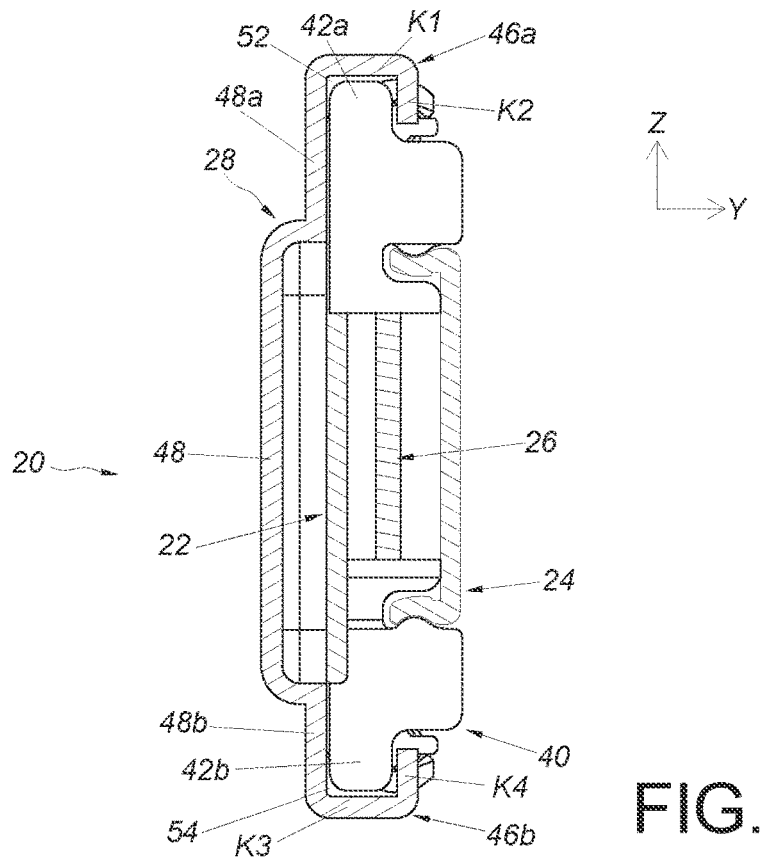
FIG. 4 is a partial sectional view of the slide rail assembly according to the first embodiment of the present invention, showing the slide rail assembly in a predetermined state.

Referring to FIG. 2 to FIG. 4, the connecting member 40 includes an upper section 42a, a lower section 42b, and a middle section 44 between the upper section 42a and the lower section 42b. The supporting feature 28 includes an upper supporting wall 46a, a lower supporting wall 46b, and a middle wall 48 connected between the upper supporting wall 46a and the lower supporting wall 46b. The lower supporting wall 46b of the supporting feature 28 is configured to support the lower section 42b of the connecting member 40, or the upper supporting wall 46a of the supporting feature 28 is configured to support the upper section 42a of the connecting member 40.

It can be known from the above that when the slide rail assembly 20 is in the predetermined state (e.g., the retracted state), the third rail 26, which is shorter than the second rail 24, is unable to support the aforesaid end portion (e.g., the first end portion 24a) and the adjacent rail section of the second rail 24; however, with the connecting member 40 supported by the supporting feature 28, the second rail 24 is still supported while at the retracted position R. This ensures the structural strength or stability of the slide rail assembly 20 when the slide rail assembly 20 is in the predetermined state.

Preferably, the upper supporting wall 46a of the supporting feature 28 is configured to at least partially enclose the upper section 42a of the connecting member 40, or the lower supporting wall 46b of the supporting feature 28 is configured to at least partially enclose the lower section 42b of the connecting member 40 so that when the slide rail assembly 20 is in the predetermined state (e.g., the retracted state), in which the second rail 24 is at the retracted position R, the first rail 22 can enclose the connecting member 40 through the supporting feature 28 to prevent the connecting member 40 from being moved in the vertical direction (i.e., the Z-axis direction) or the transverse direction (i.e., the Y-axis direction), and the stability of the mechanism is thus ensured.

More specifically, the upper supporting wall 46a of the supporting feature 28 has a first supporting section K1 and a second supporting section K2 substantially perpendicularly connected to the first supporting section K1. The first supporting section K1, the second supporting section K2, and a first wall portion 48a of the middle wall 48 jointly define a first space 52 for receiving at least a portion of the upper section 42a of the connecting member 40 (see FIG. 4). Or, the lower supporting wall 46b of the supporting feature 28 has a third supporting section K3 and a fourth supporting section K4 substantially perpendicularly connected to the third supporting section K3, and the third supporting section K3, the fourth supporting section K4, and a second wall portion 48b of the middle wall 48 jointly define a second space 54 for receiving at least a portion of the lower section 42b of the connecting member 40 (see FIG. 4).

Figure 5:
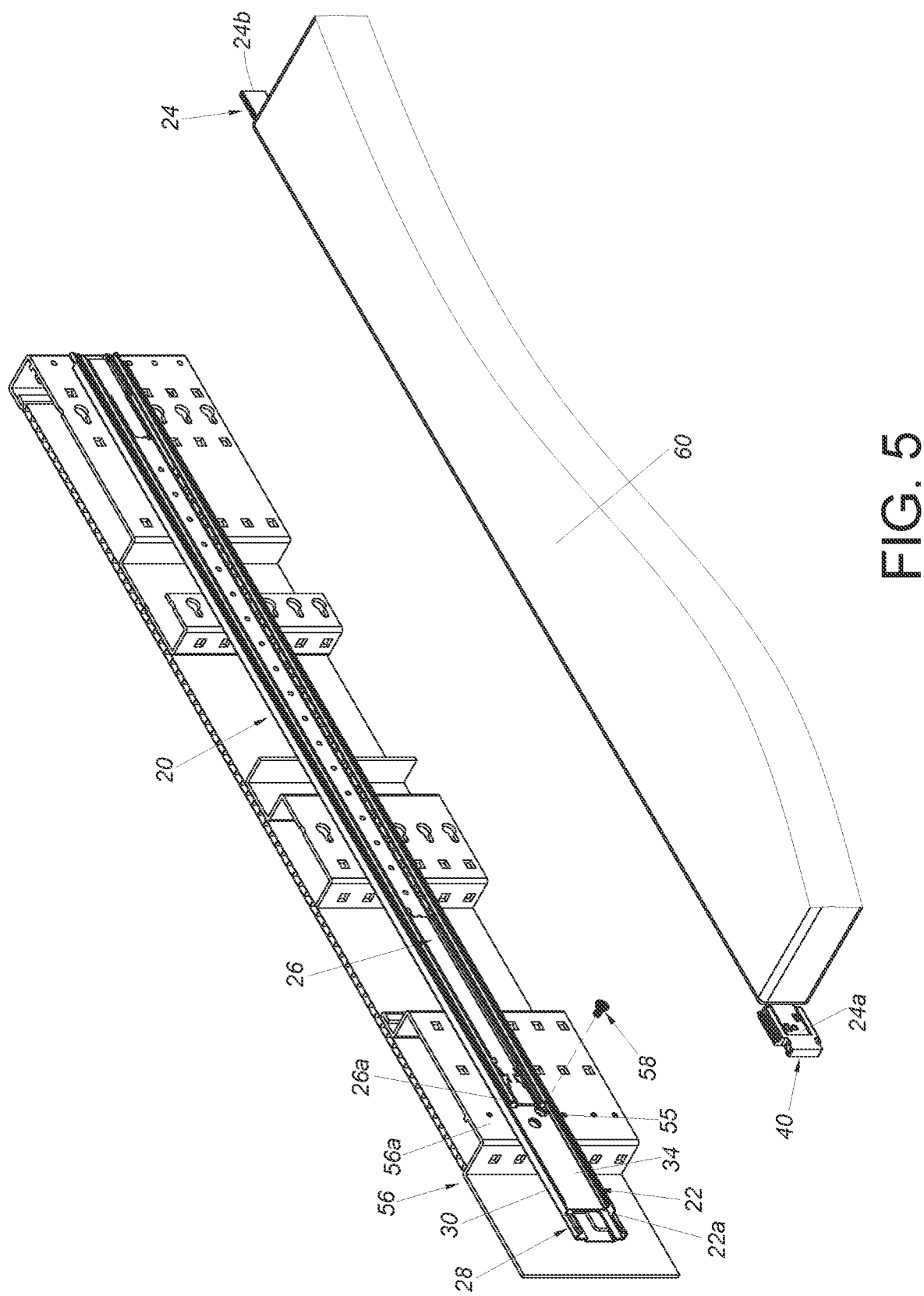
FIG. 5 is a schematic view showing that the first rail of the slide rail assembly according to the first embodiment of the present invention can be mounted on a rack via a mounting member, and that an object can be mounted on the third rail, which is in a channel of the first rail, via the second rail.
Figure 6:
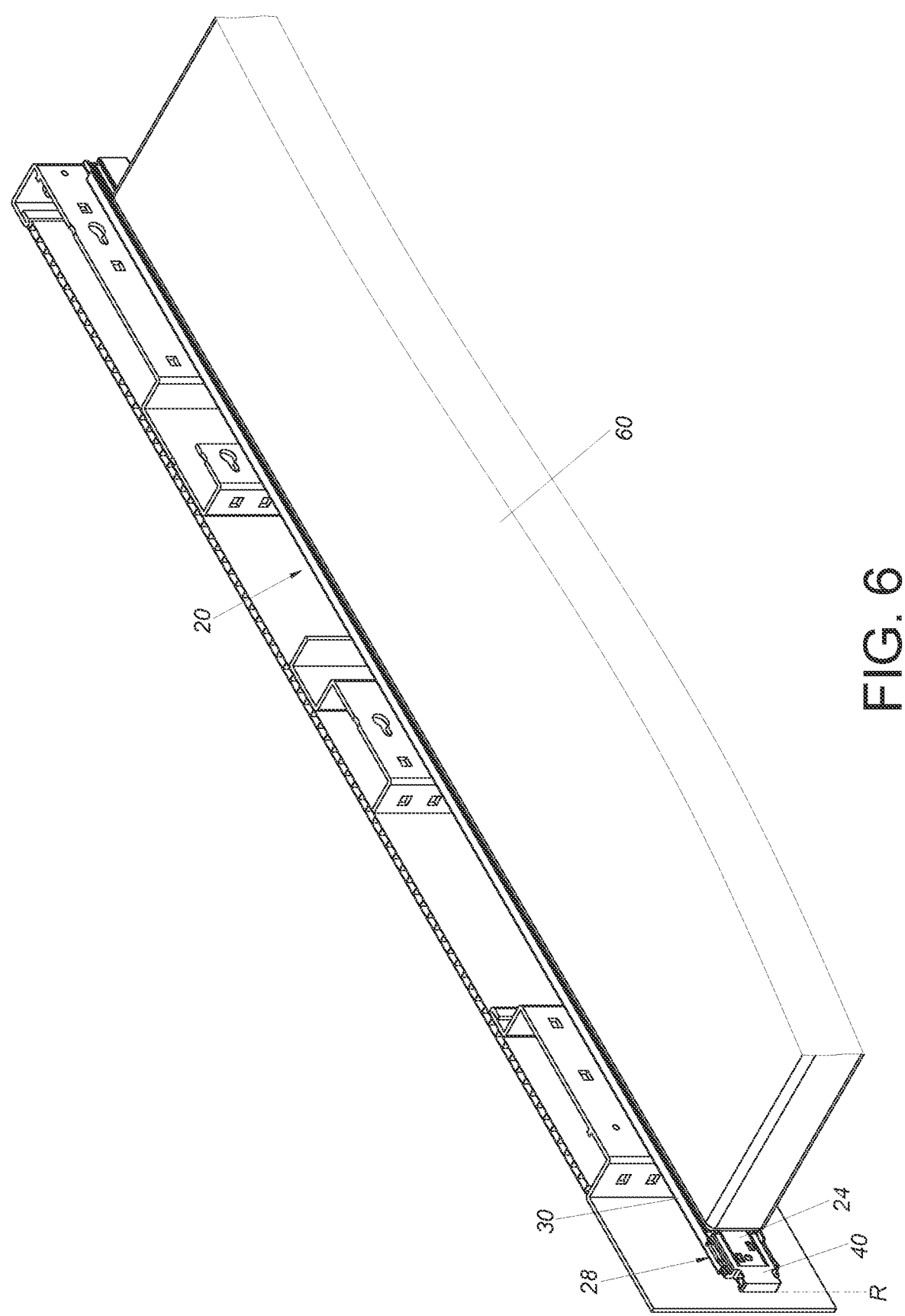
FIG. 6 is a schematic view showing that the slide rail assembly according to the first embodiment of the present invention is mounted on the rack.

Referring to FIG. 5 and FIG. 6, the slide rail assembly 20 is adapted for use on a rack 56. To mount the first rail 22 on the rack 56, at least one mounting feature 55 (e.g., at least one hole) must be disposed at a predetermined portion of (the longitudinal wall 34 of) the first rail 22, and the third rail 26 must be shorter than the first rail 22 in order for at least one mounting member 58 (such as but not limited to at least one screw or bolt) to be inserted into the mounting feature 55 and thereby fix the first rail 22 to a post 56a of the rack 56. It is worth mentioning that once mounted on the rack 56, the mounting member 58 does not block the path of displacement of the third rail 26 but allows the third rail 26 to be longitudinally displaced with respect to the first rail 22.

More specifically, when the slide rail assembly 20 is in the predetermined state (e.g., the retracted state), the third rail 26 is retracted with respect to the first rail 22, and the mounting member 58 is adjacent to the aforesaid end portion (e.g., the first end portion 26a) of the third rail 26. Moreover, when the slide rail assembly 20 is in the predetermined state (e.g., the retracted state), the third rail 26 is retracted with respect to the first rail 22, the second rail 24 is at the retracted position R with respect to the third rail 26, and the supporting feature 28 protrudes beyond the aforesaid end portion (e.g., the first end portion 26a) of the third rail 26 by the predetermined longitudinal distance L (see FIG. 2) and supports the second rail 24 via the connecting member 40. Thus, the structural strength or stability of the slide rail assembly 20 in the predetermined state is ensured. It is worth mentioning that the second rail 24 can be used to carry an object 60.

Figure 7:
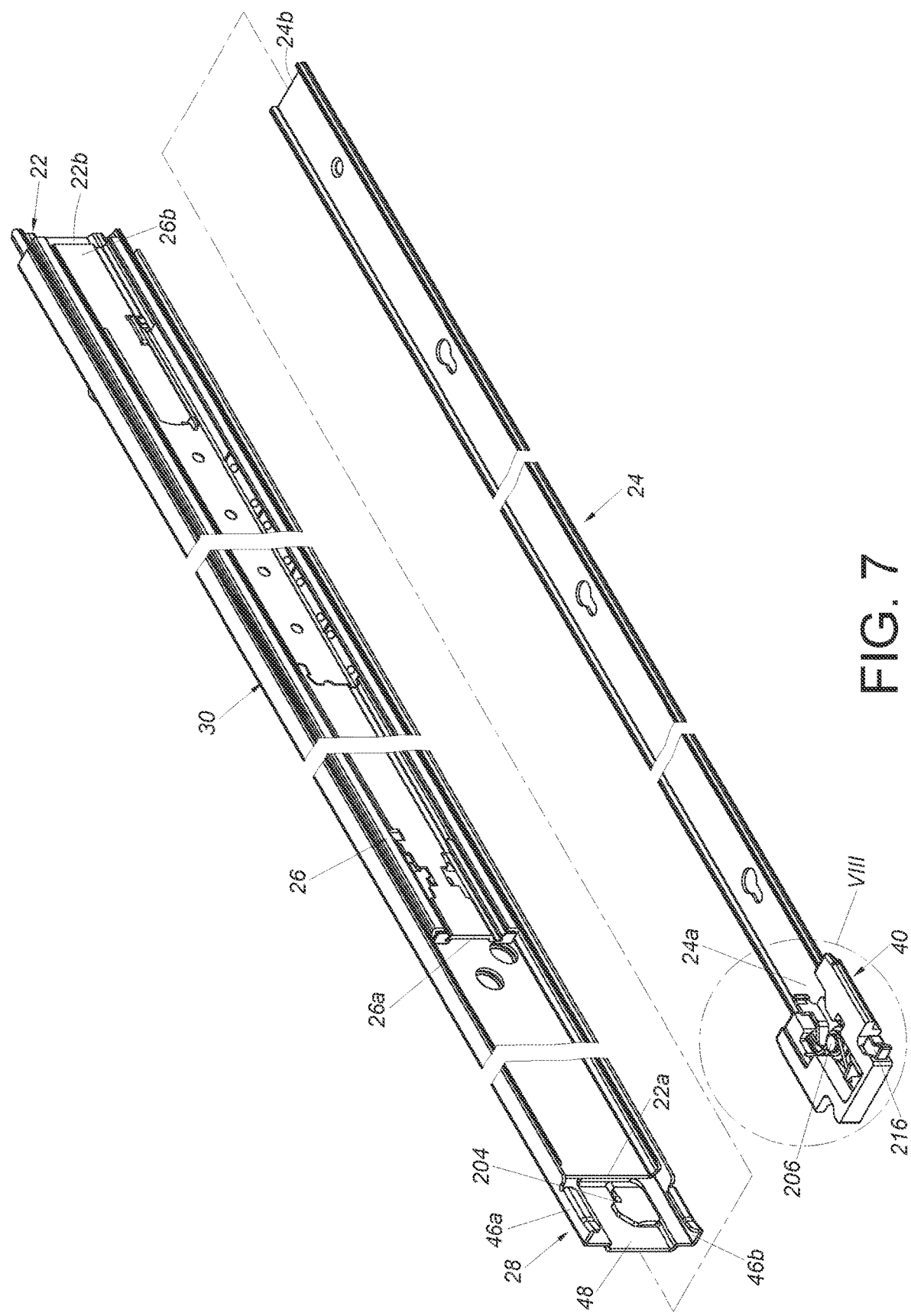
FIG. 7 is an exploded perspective view of the slide rail assembly according to a second embodiment of the present invention.
Figure 8:
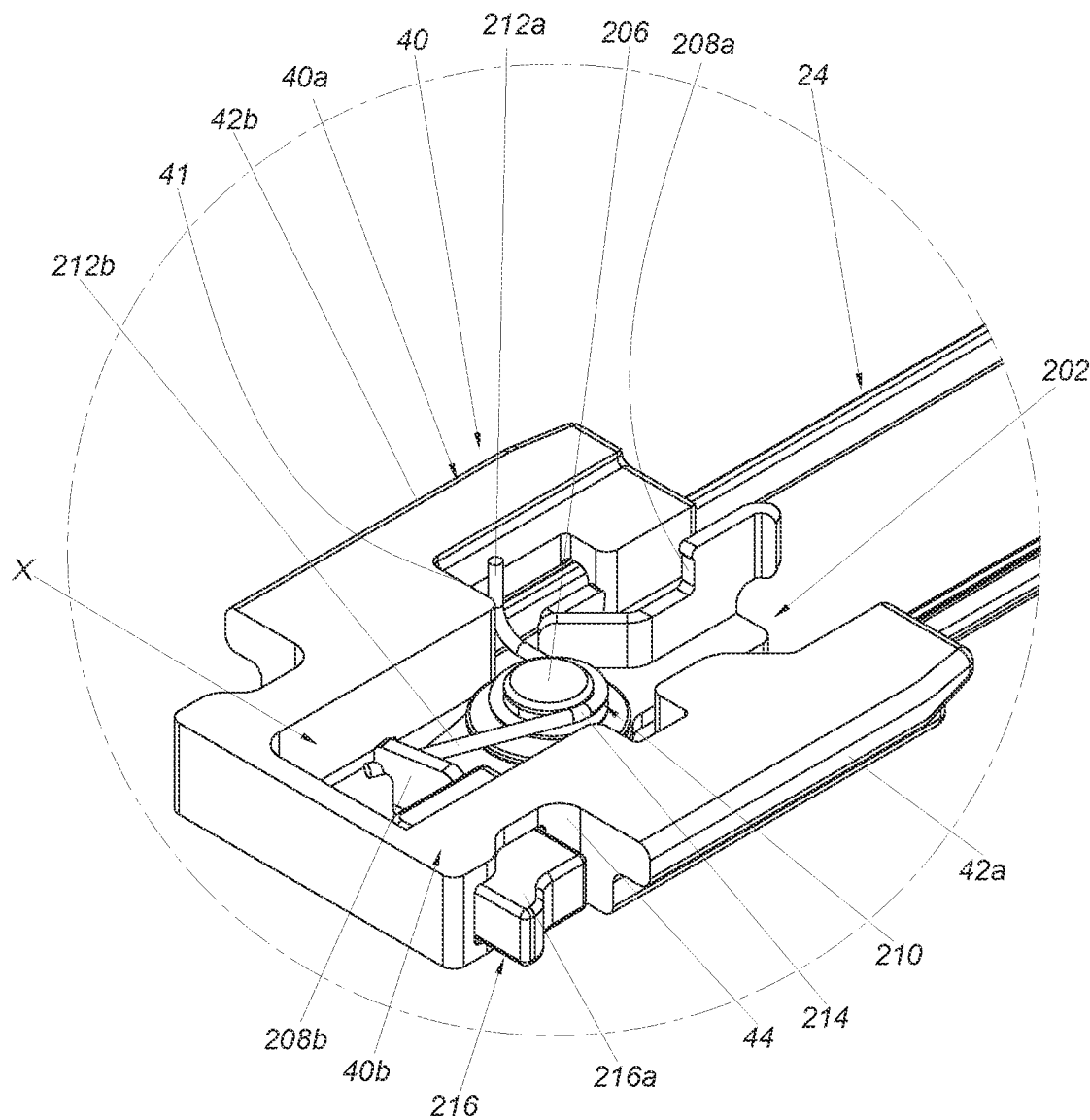
FIG. 8 is an enlarged view of the designated area in FIG. 7.

FIG. 7 to FIG. 9 show the slide rail assembly according to the second embodiment of the present invention. The second embodiment is different from the first embodiment substantially in that the slide rail assembly according to the second embodiment further includes a locking member 202 movable with respect to the second rail 24, and that a blocking portion 204 configured to work with the locking member 202 is disposed at one of the supporting member 30 and the first rail 22. Here, the blocking portion 204 is disposed at (the middle wall 48 of) the supporting feature 28 of the supporting member 30 by way of example only. Preferably, a predetermined structure 205 is disposed at (the middle wall 48 of) the supporting feature 28 of the supporting member 30 and has the blocking portion 204.

Preferably, the locking member 202 is connected to one of the second rail 24 and the connecting member 40 in an operable manner. Here, the locking member 202 is pivotally connected to the second rail 24 via a shaft 206. The locking member 202 has a locking portion 208a and a driving portion 208b, and the shaft 206 is located between the locking portion 208a and the driving portion 208b.

Preferably, the slide rail assembly further includes an elastic member 210 for applying an elastic force to the locking member 202, and the elastic member 210 has a first elastic portion 212a, a second elastic portion 212b, and a mounting portion 214 connected between the first elastic portion 212a and the second elastic portion 212b. The mounting portion 214 is mounted around the shaft 206. The second elastic portion 212b is adjacent to and in contact with the driving portion 208b.

Preferably, the slide rail assembly further includes an operating member 216 with which to operate, and thereby move, the locking member 202.

More specifically, when the slide rail assembly is in a retracted state, the third rail 26 is retracted with respect to the first rail 22, and the second rail 24 is at the retracted position R with respect to the third rail 26 (the foregoing relative positions of the first to the third rails have been detailed above and shown in FIG. 2 in relation to the first embodiment and, for the sake of brevity, will not be described repeatedly); moreover, the second rail 24 is locked with respect to the first rail 22 owing to the locking member 202 being in a locking state S1, in which the locking member 202 is locked to the blocking portion 204 to prevent the second rail 24 from moving away from the retracted position R in an opening direction D1 with respect to the first rail 22 (see FIG. 9). In addition, when the slide rail assembly is in the retracted state, the supporting feature 28 protrudes beyond an end portion (e.g., the first end portion 26a) of the third rail 26 by the predetermined longitudinal distance L and supports the second rail 24 (these two features of the second rail 24 have been detailed above and shown in FIG. 2 in relation to the first embodiment and, for the sake of brevity, will not be described repeatedly).

Preferably, when the second rail 24 is at the retracted position R with respect to the first rail 22, the upper section 42a and the lower section 42b of the connecting member 40 are supported by the upper supporting wall 46a and the lower supporting wall 46b of the supporting feature 28 respectively such that the second rail 24 remains supported while at the retracted position R. This not only ensures the structural strength of the slide rail assembly 20 when the slide rail assembly 20 is in the predetermined state (see FIG. 9 or FIG. 4), but also allows the locking member 202 to be stably locked to the blocking portion 204 while in the locking state S1 (see FIG. 9).

Preferably, when the second rail 24 is at the retracted position R with respect to the first rail 22, the upper supporting wall 46a and the lower supporting wall 46b of the supporting feature 28 respectively and at least partially enclose the upper section 42a and the lower section 42b of the connecting member 40 to prevent the connecting member 40 from being moved in the vertical direction (i.e., the Z-axis direction) or the transverse direction (i.e., the Y-axis direction), and to thereby ensure the stability of the mechanism (see FIG. 9 or FIG. 4).

Preferably, when the second rail 24 is at the retracted position R, the first elastic portion 212a of the elastic member 210 is in contact with the predetermined structure 205 and located between the predetermined structure 205 and a wall surface 41 of the connecting member 40 to keep the locking member 202 in the locking state S1. The first elastic portion 212a of the elastic member 210 in this state also stores an elastic force (see FIG. 9). On the other hand, the second elastic portion 212b of the elastic member 210 applies a second elastic force to the driving portion 208b of the locking member 202, and the driving portion 208b of the locking member 202 acts on the operating member 216 in response to the second elastic force such that the operating member 216 is exposed from the connecting member 40 of the second rail 24.

Preferably, as shown in FIG. 8, the connecting member 40 has a main body portion 40a and an extension portion 40b. The main body portion 40a includes the upper section 42a, the lower section 42b, and the middle section 44, which lies between the upper section 42a and the lower section 42b. The extension portion 40b is connected to the middle section 44 of the main body portion 40a, and the operating member 216 is movably mounted on the extension portion 40b of the connecting member 40.

Preferably, the operating member 216 can be operated and thus moved in a receiving space X of the connecting member 40 (see FIG. 9). When the locking member 202 is in the locking state S1, the locking portion 208a of the locking member 202 forms a locking relationship with the blocking portion 204, and the operating member 216 is at a first position P1, with at least a portion 216a (e.g., an operating portion) of the operating member 216 exposed from the receiving space X (see FIG. 9) so that a user can tell that the locking member 202 is in the locking state S1. For example, when the second rail 24 is at the retracted position R, a user can tell from the exposed portion 216a that the locking member 202 is in the locking state S1 and is locked to the blocking portion 204.

Referring to FIG. 9 to FIG. 11, once the locking member 202 is operated and thereby switched from the locking state S1 (see FIG. 9) to an unlocking state S2 (see FIG. 10), the locking relationship between the locking portion 208a of the locking member 202 and the blocking portion 204 is terminated; in other words, the locking member 202 is no longer locked to the blocking portion 204, and the second rail 24 is therefore no longer locked with respect to the first rail 22. The second rail 24 in this state can be moved away from the retracted position R in the opening direction D1 with respect to the first rail 22. For example, the second rail 24 can be longitudinally displaced with respect to the first rail 22 from the retracted position R (see FIG. 10) to an extended position E (see FIG. 11) in the opening direction D1.

Preferably, the operating member 216 can be used to operate the locking member 202 and thereby switch the locking member 202 from the locking state S1 to the unlocking state S2. For example, a user may apply a force F to the operating member 216 so that the operating member 216 is moved from the first position P1 to a second position P2 and comes into contact with the driving portion 208b of the locking member 202. As the application of the force F continues, the second elastic portion 212b of the elastic member 210 stores an elastic force, and the locking member 202 is pivoted through an angle from a position corresponding to the locking state S1 (see FIG. 9) to a position corresponding to the unlocking state S2 (see FIG. 10), in which the locking portion 208a of the locking member 202 is no longer locked to the blocking portion 204. If the user stops applying the force F to the operating member 216 without pulling the second rail 24 out in the opening direction D1, the driving portion 208b of the locking member 202 will act on the operating member 216 in response to the second elastic portion 212b of the elastic member 210 releasing the elastic force stored therein, thereby exposing the operating member 216 from the connecting member 40 of the second rail 24 again.

It is worth mentioning that when the second rail 24 is at the extended position E with respect to the first rail 22 (see FIG. 11), the first elastic portion 212a of the elastic member 210 is no longer in contact with the predetermined structure 205 or located between the predetermined structure 205 and the wall surface 41 of the connecting member 40 and therefore releases the stored elastic force, so that the operating member 216 will stay at the second position P2.

Referring to FIG. 11 and FIG. 12, while the second rail 24 is being displaced with respect to the first rail 22 from the extended position E (see FIG. 11) to the retracted position R in a retracting direction D2, the first elastic portion 212a of the elastic member 210 comes into contact with the predetermined structure 205 (see FIG. 12) and ends up lying between the predetermined structure 205 and the wall surface 41 of the connecting member 40, storing an elastic force again (see FIG. 10). As a result, the locking member 202 is switched from the unlocking state S2 (see FIG. 10) back to the locking state S1 (see FIG. 9), and the operating member 216 is driven from the second position P2 (see FIG. 10) back to the first position P1 (see FIG. 9) by the driving portion 208b of the locking member 202. Therefore, when the second rail 24 is at a certain retracted position, a user can tell from the position of the operating member 216 if the locking member 202 is in the locking state S1, i.e., if the second rail 24 has reached and is locked at the retracted position R.

Figure 13:
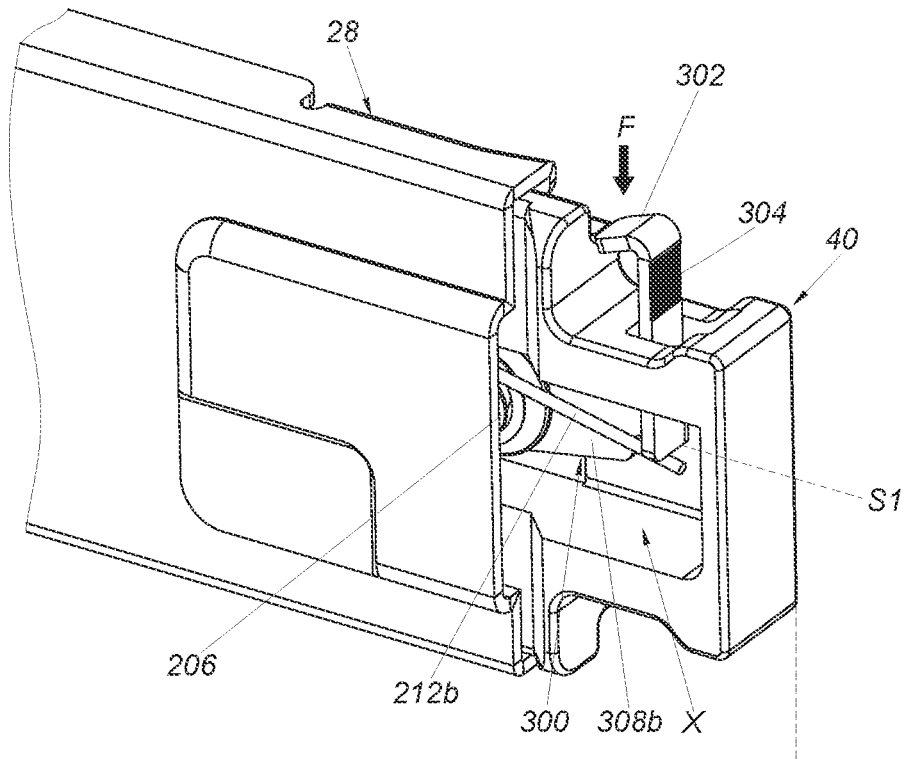
FIG. 13 is a partial perspective view of the slide rail assembly according to a third embodiment of the present invention, showing the locking member in a locking state.
Figure 14:
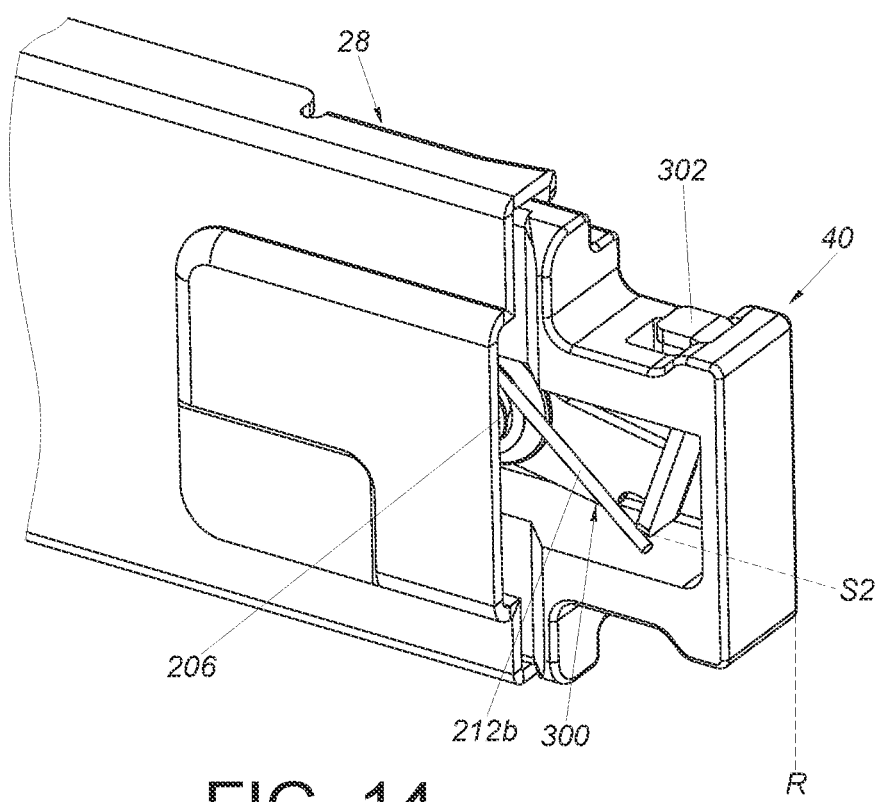
FIG. 14 is a partial perspective view of the slide rail assembly according to the third embodiment of the present invention, showing the locking member in an unlocking state.

FIG. 13 and FIG. 14 show the slide rail assembly according to the third embodiment of the present invention. The third embodiment is different from the second embodiment substantially in that the operating member 216 in the second embodiment is dispensed with. In the third embodiment, the locking member 300 can be directly operated in order to be switched from the locking state S1 (see FIG. 13) to the unlocking state S2 (see FIG. 14), and the locking member 300 has at least one portion 302 (e.g., an operating portion) connected to the driving portion 308b.

More specifically, the locking member 300 can be operated and thus moved in the receiving space X of the connecting member 40. When the locking member 300 is in the locking state S1 (see FIG. 13), the at least one portion 302 of the locking member 300 is exposed from the receiving space X so that a user can tell if the locking member 300 is in the locking state S1. Preferably, the at least one portion 302 of the locking member 300 has an identification feature 304 (such as but not limited to a color, shape, word, or symbol) to make it easier for a user to tell if the locking member 300 is in the locking state S1 (see FIG. 13). A user may apply a force F to the at least one portion 302 of the locking member 300 to switch the locking member 300 from the locking state S1 (see FIG. 13) to the unlocking state S2 (see FIG. 14).

Figure 15:
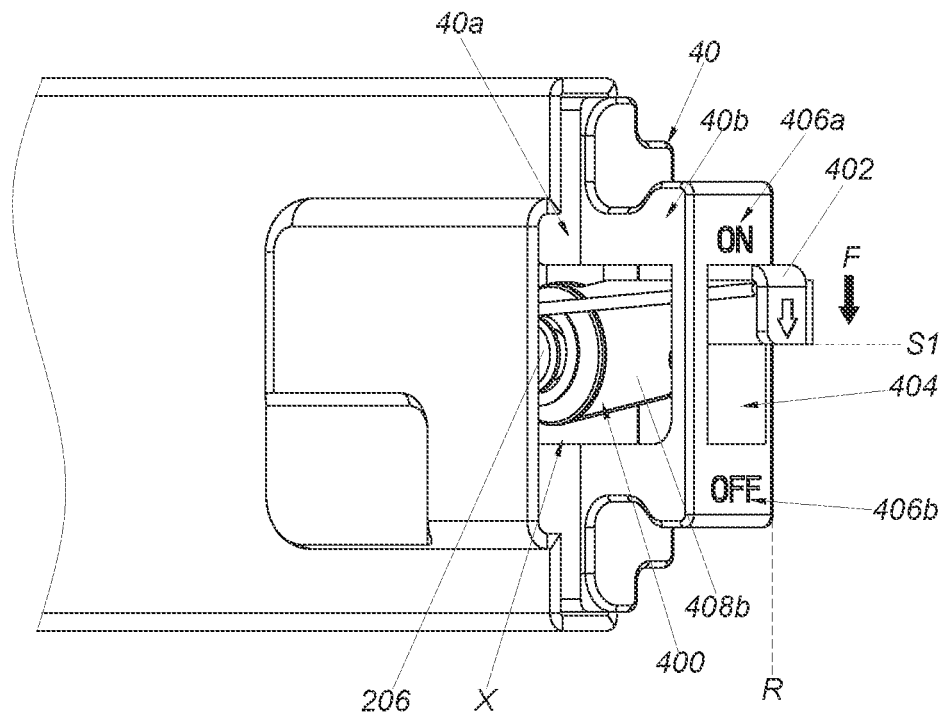
FIG. 15 is a schematic view of the slide rail assembly according to a fourth embodiment of the present invention, with the locking member in the locking state.
Figure 16:
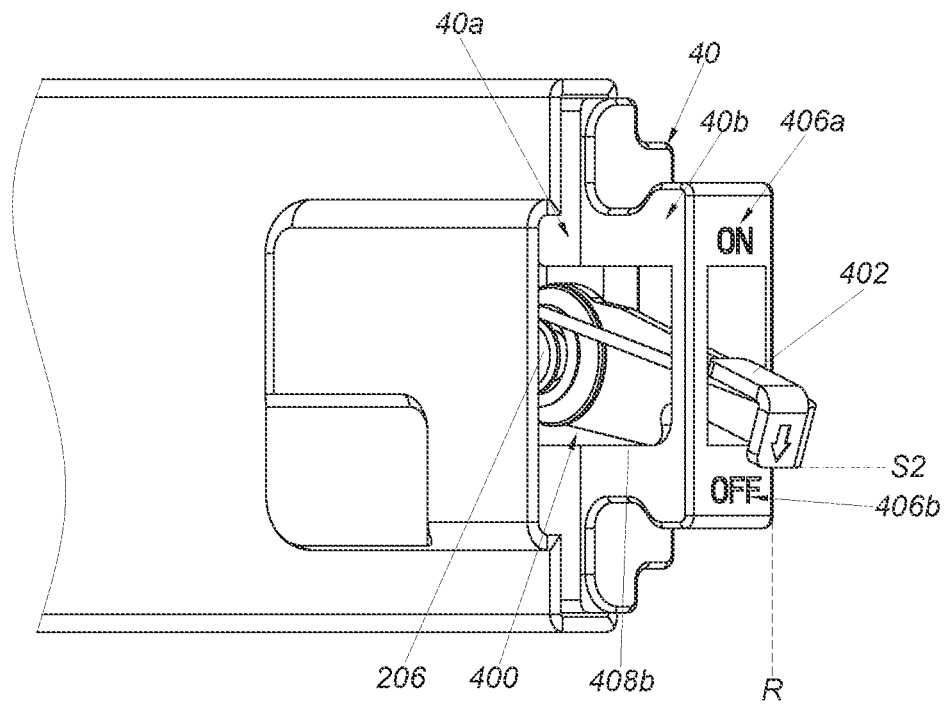
FIG. 16 is a schematic view of the slide rail assembly according to the fourth embodiment of the present invention, with the locking member in the unlocking state.

FIG. 15 and FIG. 16 show the slide rail assembly according to the fourth embodiment of the present invention. The fourth embodiment is different from the second embodiment substantially in that the operating member 216 in the second embodiment is dispensed with. In the fourth embodiment, the locking member 400 can be directly operated in order to be switched from the locking state S1 (see FIG. 15) to the unlocking state S2 (see FIG. 16), and the locking member 400 has at least one portion 402 (e.g., an operating portion) connected to the driving portion 408b.

Preferably, a predetermined portion (e.g., the extension portion 40b) of the connecting member 40 has an opening 404 in communication with the receiving space X of the connecting member 40, and the at least one portion 402 of the locking member 400 is exposed from the receiving space X through the opening 404.

Preferably, the predetermined portion (e.g., the extension portion 40b) of the connecting member 40 has at least one identification feature (such as but not limited to a color, shape, word, or symbol), e.g., a first identification feature 406a and a second identification feature 406b, from which a user can tell if the locking member 400 is in one of the locking state S1 and the unlocking state S2. More specifically, when the locking member 400 is in the locking state S1, the at least one portion 402 (e.g., the operating portion) corresponds in position to the first identification feature 406a (see FIG. 15) to indicate that the locking member 400 is in the locking state S1. When the locking member 400 is in the unlocking state S2, the at least one portion 402 (e.g., the operating portion) corresponds in position to the second identification feature 406b instead (see FIG. 16) to indicate that the locking member 400 is in the unlocking state S2. A user may apply a force F to the at least one portion 402 of the locking member 400 to switch the locking member 400 from the locking state S1 (see FIG. 15) to the unlocking state S2 (see FIG. 16).

According to the above, the slide rail assembly 20 disclosed herein preferably has at least the following features:
1. When the slide rail assembly 20 is in the predetermined state, the supporting feature 28 protrudes beyond an end portion of the third rail 26 by the predetermined longitudinal distance L and supports the second rail 24.
2. The third rail 26 is movably disposed between the first rail 22 and the second rail 24 and is shorter than the first rail 22 and the second rail 24.

3. When the slide rail assembly 20 is in the predetermined state (e.g., the retracted state), the connecting member 40 is supported by the supporting feature 28 such that the second rail 24 remains supported while at the retracted position R. This not only ensures the structural strength or stability of the slide rail assembly 20 when the slide rail assembly 20 is in the predetermined state, but also allows the locking member 202 to be stably locked to the blocking portion 204 while in the locking state S1.

4. When the slide rail assembly 20 is in the predetermined state (e.g., the retracted state), the first rail 22 encloses the connecting member 40 via the supporting feature 28. Thus, when the second rail 24 is at the retracted position R, the connecting member 40 is kept from being moved in the vertical direction (i.e., the Z-axis direction) or the transverse direction (i.e., the Y-axis direction), and the stability of the mechanism is ensured.

5. The at least one portion 216a (e.g., the operating portion) of the operating member 216 can be exposed from the receiving space X (see FIG. 9) so that a user can tell if the locking member 202 is in the locking state S1.

6. When the operating member 216 is dispensed with, the locking member (300; 400) can be directly operated (see FIG. 13 and FIG. 14, and FIG. 15 and FIG. 16) and has the identification feature(s) (304; 406a, 406b) from which a user can tell if the locking member (300; 400) is in the locking state S1 or the unlocking state S2.

While the present invention has been disclosed by way of the preferred embodiments described above, those embodiments are not intended to be restrictive of the scope of the invention. The scope of the patent protection sought by the applicant is defined by the appended claims.

What is claimed is:

1. A slide rail assembly, comprising:
a first rail including a supporting feature adjacent to an end portion of the first rail;
a second rail having an upper wall, a lower wall, and an end portion, said second rail being longitudinally displaceable with respect to the first rail;
a third rail movably disposed between the first rail and the second rail; and
a connecting member disposed at the end portion of the second rail;
wherein, when the slide rail assembly is in a predetermined state, the supporting feature protrudes beyond an end portion of the third rail by a predetermined longitudinal distance and supports the second rail via the connecting member, and wherein the connecting member is connected to the end portion of the second rail in an embracing relationship therewith;
wherein the connecting member includes an upper section, a lower section, and a middle section between the upper section and the lower section, wherein the supporting feature includes an upper supporting wall, a lower supporting wall, and a middle wall connected between the upper supporting wall and the lower supporting wall, wherein the lower supporting wall of the supporting feature is configured to support the lower section of the connecting member, and wherein the upper supporting wall of the supporting feature is configured to support the upper section of the connecting member;
wherein the upper supporting wall and the lower supporting wall of the supporting feature are configured to at least partially enclose the upper section and the lower section of the connecting member respectively; and
wherein said connecting member is disposed with said upper section thereof secured between said upper supporting wall of said supporting feature and the upper wall of said second rail at said end portion thereof, and with said lower section thereof secured between said lower supporting wall of said supporting feature and the lower wall of said second rail at said end portion thereof, thereby supporting said second rail, at the end portion thereof, by said supporting feature via said connecting member.

2. The slide rail assembly of claim 1 wherein the first rail has a first wall, a second wall, and a longitudinal wall connected between the first wall and the second wall of the first rail; the first rail is provided with a supporting member; the supporting member has a first supporting portion, a second supporting portion, and a longitudinal portion connected between the first supporting portion and the second supporting portion of the supporting member; and the first supporting portion, the second supporting portion, and the longitudinal portion of the supporting member are respectively adjacent to the first wall, the second wall, and the longitudinal wall of the first rail.

3. The slide rail assembly of claim 1, wherein a locking member is movable with respect to the second rail; when the slide rail assembly is in a retracted state, the third rail is retracted with respect to the first rail, the second rail is at a retracted position with respect to the third rail, and the second rail is locked with respect to the first rail by the locking member in a locking state and is thereby kept from moving away from the retracted position in an opening direction; and once the locking member is operated and thereby switched to an unlocking state, the second rail is no longer locked with respect to the first rail and is allowed to move away from the retracted position in the opening direction.

4. The slide rail assembly of claim 3, wherein a connecting member is disposed at the second rail, the locking member is able to be operated and thus moved in a receiving space of the connecting member, and at least a portion of the locking member is exposed from the receiving space when the locking member is in one of the locking state and the unlocking state.

5. The slide rail assembly of claim 3, wherein a connecting member is disposed at the second rail, the slide rail assembly further comprises an operating member with which to operate the locking member and thereby switch the locking member from the locking state to the unlocking state, the operating member is able to be operated and thus moved in a receiving space of the connecting member, and at least a portion of the operating member is exposed from the receiving space when the locking member is in one of the locking state and the unlocking state.

6. A slide rail assembly, comprising:
a first rail;
a second rail having an upper wall and a lower wall and longitudinally displaceable with respect to the first rail;
a third rail movably disposed between the first rail and the second rail;
a locking member movable with respect to the second rail;
a supporting feature is disposed at the first rail; and
a connecting member disposed at the second rail;
wherein, when the slide rail assembly is in a retracted state, the third rail is retracted with respect to the first rail, the second rail is at a retracted position with respect to the third rail, and the second rail is locked with respect to the first rail by the locking member in a locking state and is thereby kept from moving away from the retracted position in an opening direction; and, once the locking member is operated and thereby switched to an unlocking state, the second rail is no longer locked with respect to the first rail and is allowed to move away from the retracted position in the opening direction;

wherein the locking member is connected to one of the second rail and the connecting member in an operable manner, and the supporting feature supports the second rail via the connecting member when the slide rail assembly is in the retracted state;

wherein the connecting member has a main body portion; the main body portion includes an upper section, a lower section, and a middle section between the upper section and the lower section; the supporting feature includes an upper supporting wall, a lower supporting wall, and a middle wall connected between the upper supporting wall and the lower supporting wall; and the upper supporting wall and the lower supporting wall of the supporting feature are configured to support the upper section and the lower section of the main body portion respectively, and wherein said connecting member is connected to said end portion of said second rail in an embracing relationship therewith and is disposed with said upper section thereof secured between said upper supporting wall of said supporting feature and the upper wall of said second rail at said end portion thereof, and with said lower section thereof secured between said lower supporting wall of said supporting feature and the lower wall of said second rail at said end portion thereof, thereby supporting said second rail, at the end portion thereof, by said supporting feature via said connecting member.

7. The slide rail assembly of claim 6, wherein when the slide rail assembly is in the retracted state, the supporting feature protrudes beyond an end portion of the third rail by a predetermined longitudinal distance and supports the second rail.

8. The slide rail assembly of claim 6, wherein the locking member is operated to move in a receiving space of the connecting member, and wherein at least a portion of the locking member is exposed from the receiving space when the locking member is in one of the locking state and the unlocking state.

9. The slide rail assembly of claim 6, wherein a predetermined portion of the connecting member has at least one identification feature from which a user can tell if the locking member is in one of the locking state and the unlocking state.

10. The slide rail assembly of claim 6, further comprising an operating member with which to operate the locking member and thereby switch the locking member from the locking state to the unlocking state.

11. The slide rail assembly of claim 10, wherein the operating member is operated to move in a receiving space of the connecting member, and wherein at least a portion of the operating member is exposed from the receiving space when the locking member is in one of the locking state and the unlocking state.

12. The slide rail assembly of claim 6, wherein the connecting member further includes an extension portion connected to the middle section of the main body portion, and the operating member is movably mounted on the extension portion of the connecting member.

13. The slide rail assembly of claim 7, wherein the first rail is provided with a supporting member, a blocking portion is disposed at one of the supporting member and the first rail, the blocking portion is configured to lock the locking member in the locking state, and the supporting feature is disposed at the supporting member.

* * * * *